United States Patent
Chen et al.

(10) Patent No.: US 10,630,311 B1
(45) Date of Patent: Apr. 21, 2020

(54) CORRECTION METHOD AND CORRECTION CIRCUIT FOR SIGMA-DELTA MODULATOR

(71) Applicant: REALTEK SEMICONDUCTOR CORPORATION, Hsinchu (TW)

(72) Inventors: Chih-Lung Chen, Hsinchu County (TW); Jie-Fan Lai, Hsinchu (TW); Yu-Chang Chen, New Taipei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/519,059

(22) Filed: Jul. 23, 2019

(30) Foreign Application Priority Data

Oct. 19, 2018 (TW) .............................. 1071396906 A (51) Int. Cl.
*H03M 3/00* (2006.01)
*H03L 7/08* (2006.01)

(52) U.S. Cl.
CPC .............. *H03M 3/322* (2013.01); *H03L 7/08* (2013.01); *H03M 3/32* (2013.01); *H03M 3/352* (2013.01); *H03M 3/50* (2013.01)

(58) Field of Classification Search
CPC ........ H03M 3/322; H03M 3/352; H03M 3/32; H03M 3/50; H03L 7/08
USPC ................................................. 341/143, 118
See application file for complete search history.

(56) References Cited

U.S. PATENT DOCUMENTS

| | | | |
|---|---|---|---|
| 6,943,715 B2 | 9/2005 | Radja et al. | |
| 8,324,969 B2 | 12/2012 | Loeda et al. | |
| 9,853,653 B2 * | 12/2017 | Kao | H03M 1/06 |
| 9,859,914 B1 * | 1/2018 | Weng | H03M 3/436 |
| 10,063,252 B2 * | 8/2018 | Cho | H03M 3/438 |
| 10,404,293 B2 * | 9/2019 | Talty | H04B 1/0042 |
| 2017/0126241 A1 | 5/2017 | Lee et al. | |

OTHER PUBLICATIONS

OA letter of the counterpart TW application (appl. No. 107136906) dated Aug. 20, 2019. Summary of the OA letter: Claims 1, 6 are anticipated by the cited reference 1 (US20170126241).

IEEE paper: 2016_04_JSSC_[BCM] A 10_20_30_40 MHz Feedforward FIR DAC CTSDM. Sebastian Loeda et al., "A 10/20/30/40 MHz Feedforward FIR DAC Continuous-Time ΔΣ ADC With Robust Blocker Performance for Radio Receivers", Apr. 2016, pp. 860-870, vol. 51, No. 4 IEEE Journal of Solid-State Circuits.

(Continued)

*Primary Examiner* — Brian K Young
(74) *Attorney, Agent, or Firm* — WPAT, PC (57) ABSTRACT

A correction method and a correction circuit for a sigma-delta modulator (SDM) are provided. The SDM includes a loop filter, a quantizer, and a digital-to-analog converter (DAC). The correction method includes: generating a test signal for a frequency to be tested; inputting the test signal to a feedforward circuit that includes at least one adjustable impedance circuit, the test signal being inputted to the SDM through the impedance circuit; calculating an output signal of the SDM to obtain a value of a signal transfer function (STF) of the SDM at the frequency to be tested; and adjusting the impedance circuit.

15 Claims, 9 Drawing Sheets

(56) References Cited

OTHER PUBLICATIONS

J. De Maeyer et al., "Controlled behaviour of STF in CT spl Sigma spl Delta modulators", Aug. 4, 2005, vol. 41 No. 16, Electronics Letters.
OA letter of counterpart TW application of application No. 107136906 dated Jan. 28, 2019. 1. Claims 1-2 and 6-7 are anticipated by reference 1 (U.S. Pat. No. 6,943,715 B2). 2. Reference 1 (U.S. Pat. No. 6,9437,15 B2) renders claims 3 and 8 obvious.
OA letter of counterpart TW application of application No. 107136906 dated Mar. 28, 2019. Claims 1-2 and 6-7 are anticipated by reference 1 (U.S. Pat. No. 8,324,969 B2).

\* cited by examiner

CORRECTION METHOD AND CORRECTION CIRCUIT FOR SIGMA-DELTA MODULATOR

BACKGROUND

1. Field of the Disclosure

The present disclosure generally relates to sigma-delta modulators (SDMs), and, more particularly, to a correction method and a correction circuit for SDMs.

2. Description of Related Art

A sigma-delta modulator (SDM) can be used as an analog-to-digital converter (ADC). However, because the SDM is susceptible to process, voltage and temperature (PVT), the ADC may suffer resolution degradation or even error. Circuit designers usually want the SDMs to operate in accordance with the originally designed signal transfer function (STF), but PVT variations often cause the practical NTF to deviate from the originally designed NTF. Therefore, a correction method and a correction circuit are needed to correct the SDM to ensure the efficiency and correctness of the SDM.

SUMMARY

In view of the issues of the prior art, an object of this disclosure is to provide a correction method and a correction circuit for sigma-delta modulators (SDMs) to make the SDMs less susceptible to or free from negative influences of process, voltage and temperature (PVT).

A correction method for correcting an SDM is provided. The SDM includes a loop filter, a quantizer, and a digital-to-analog converter (DAC). The correction method includes the steps of: (A) generating a test signal for at least one frequency to be tested; (B) inputting the test signal to a feedforward circuit, wherein the feedforward circuit includes at least one impedance circuit which is adjustable, and the test signal is inputted to the SDM via the impedance circuit; (C) calculating an output signal of the SDM to obtain a value of a signal transfer function (STF) of the SDM at the frequency to be tested; and (D) adjusting the impedance circuit.

A correction circuit for correcting an SDM is provided. The SDM includes a loop filter, a quantizer, and a DAC. The correction circuit includes a feedforward circuit, a memory, and a control circuit. The feedforward circuit, which is coupled to the SDM, includes at least one impedance circuit, and is configured to receive a test signal and to input the test signal to the SDM. The memory stores multiple program instructions. The control circuit is coupled to the memory and configured to execute the program instructions to correct the SDM. The correction procedures of the SDM includes the steps of: (A) generating the test signal for at least one frequency to be tested; (B) inputting the test signal to the feedforward circuit; (C) calculating an output signal of the SDM to obtain a value of a signal transfer function (STF) of the SDM at the frequency to be tested; and (D) adjusting the impedance circuit.

According to this disclosure, the correction method and correction circuit for the SDM can correct the SDM when the chip is manufactured or before the circuit is in operation. Compared with the prior art, this disclosure can adjust the signal transfer function (NTF) for the frequency band of interest, so that the SDM can meet the design criteria (e.g., to function as expected in accordance with the originally designed STF) in the frequency band of interest. Thus, the negative impacts of PVT variations on the SDM can be significantly mitigated.

These and other objectives of this disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes correction methods and correction circuits for correcting sigma-delta modulators (SDMs). On account of that some or all elements of the correction circuits could be known, the detail of such elements is omitted provided that such detail has little to do with the features of this disclosure and this omission nowhere dissatisfies the specification and enablement requirements. Some or all of the processes of the correction methods may be implemented by software and/or firmware, and can be performed by the correction circuits or their equivalents. A person having ordinary skill in the art can choose components or steps equivalent to those described in this specification to carry out this disclosure, which means that the scope of this disclosure is not limited to the embodiments in the specification.

Figure 1A:
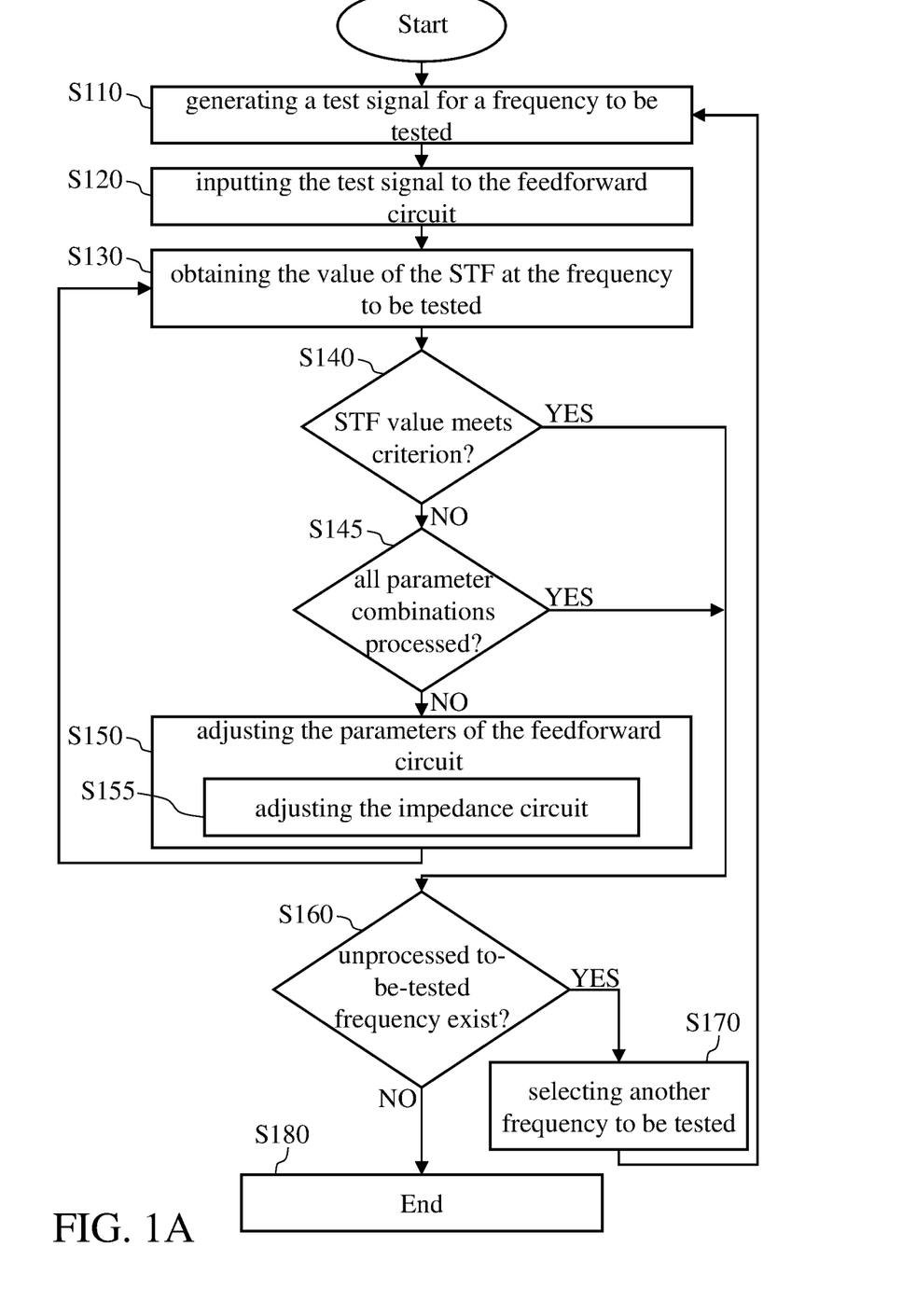
FIG. 1A illustrates a flow chart of a correction method for correcting a sigma-delta modulator (SDM) according to one embodiment of this disclosure.
Figure 2:
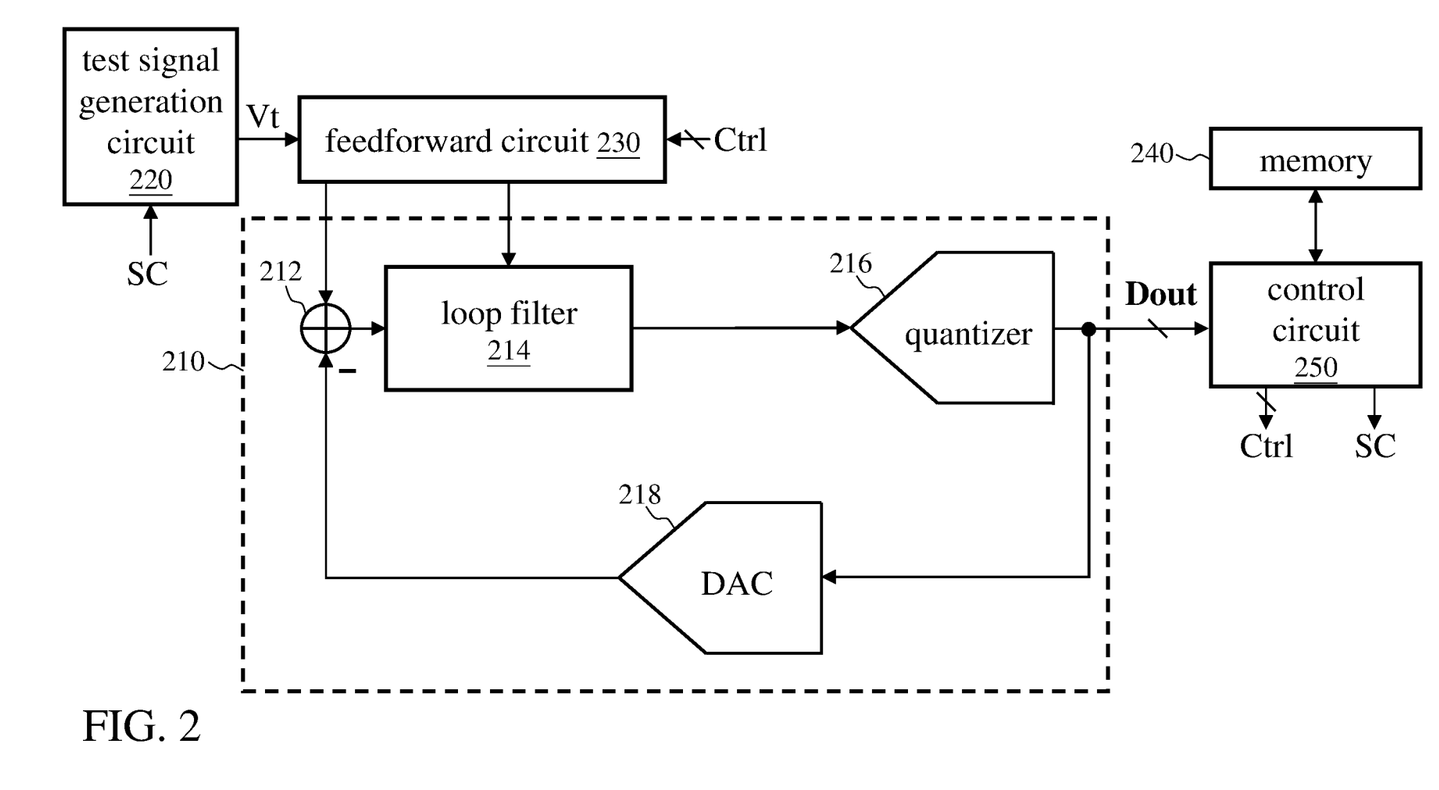
FIG. 2 illustrates a functional block diagram of a correction circuit for correcting an SDM according to an embodiment.

FIG. 1A is a flow chart of a method of correcting an SDM according to an embodiment of this disclosure, and FIG. 2 is a functional block diagram of a correction circuit for correcting an SDM according to an embodiment of this disclosure. The correction circuit includes a test signal generation circuit 220, a feedforward circuit 230, a memory 240, and a control circuit 250. The test signal generation circuit 220 is coupled to the control circuit 250 and the feedforward circuit 230, and the feedforward circuit 230 is coupled to the control circuit 250. The control circuit 250 can be a circuit that is capable of executing program codes or program instructions, such as a central processing unit (CPU), a microcontroller, a microprocessor, a digital signal processor (DSP), and the like. The memory 240 stores a plurality of program codes or program instructions, and the control circuit 250 executes the program codes or program instructions to correct the SDM 210. The SDM 210 includes an adder circuit 212, a loop filter 214, a quantizer 216, and a digital-to-analog converter (DAC) 218. References are made to FIGS. 1A and 2 for the following discussion.

When the correction process begins, the control circuit 250 controls the test signal generation circuit 220 to generate a test signal Vt for the frequency to be tested, that is, to generate the test signal Vt whose frequency is the frequency to be tested (step S110). The test signal Vt is a single tone signal, and the test signal generation circuit 220 can be a single tone generator. The test signal generation circuit 220 generates the test signal Vt according to the control value SC of the control circuit 250.

Figure 3:
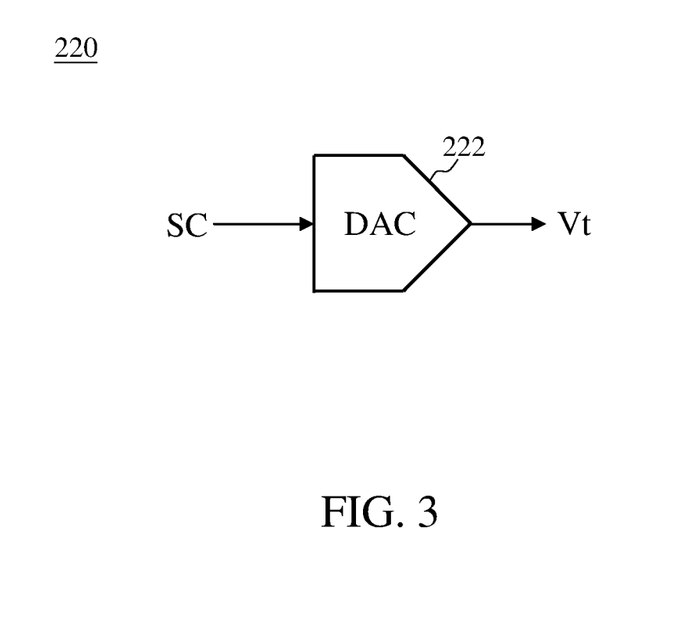
FIG. 3 is a diagram illustrating the realization of the test signal generation circuit 220 by a digital-to-analog converter (DAC).
Figure 4:
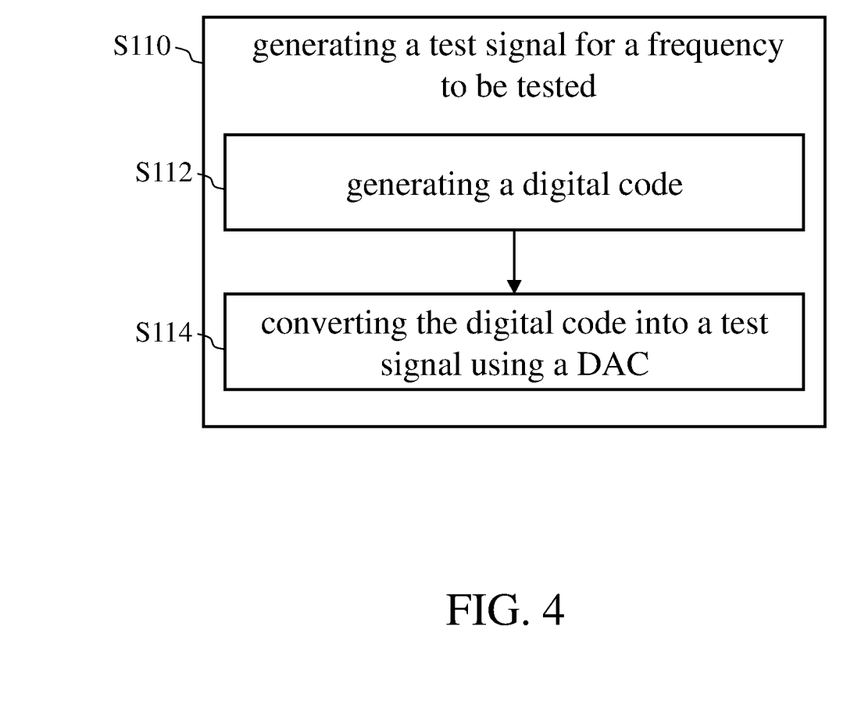
FIG. 4 illustrates the sub-steps of step S110 corresponding to the embodiment of FIG. 3.

In some embodiments, the test signal generation circuit 220 can be implemented by a DAC. FIG. 3 is a diagram illustrating the realization of the test signal generation circuit 220 by the DAC 222. FIG. 4 shows the sub-steps of step S110 corresponds to this embodiment. Step S110 includes sub-steps S112 and S114. In step S112, the control circuit 250 generates a digital code (i.e., the control value SC is a digital code), and in step S114, the DAC 222 converts the digital code to the test signal Vt (i.e., the test signal Vt being the output of the DAC 222). The frequency of the test signal Vt is related to the value of the control value SC. For example, in the event that the control value SC is an 8-bit code, the test signal Vt corresponding to the control value SC=01010101$_2$ has a higher frequency than the test signal Vt corresponding to the control value SC=11110000$_2$. In other words, the control circuit 250 can adjust the frequency of the test signal Vt by controlling the control value SC.

Figure 5:
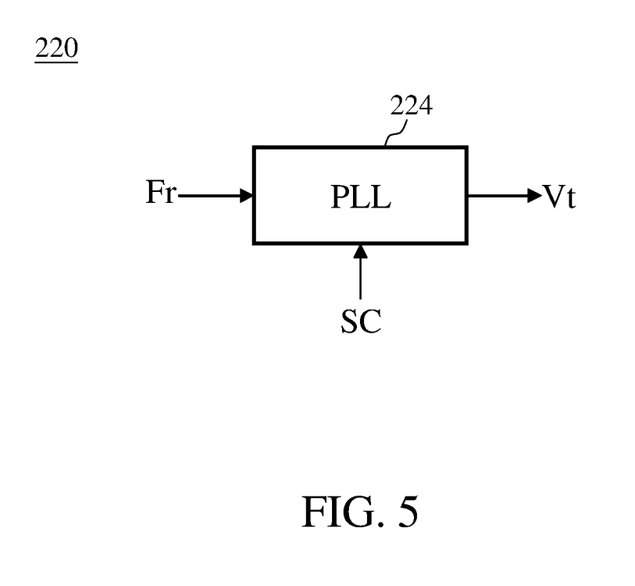
FIG. 5 is a diagram illustrating the realization of the test signal generation circuit 220 by a phase-locked loop (PLL).
Figure 6:
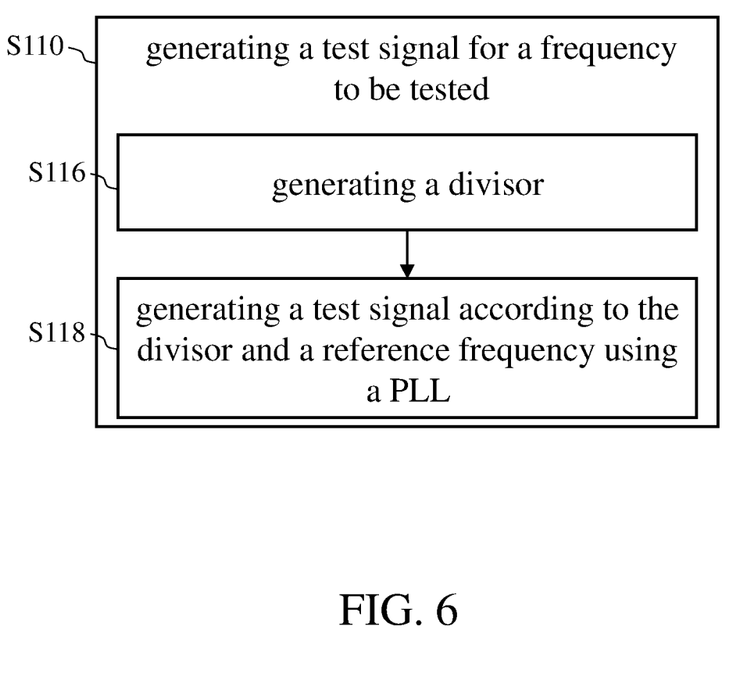
FIG. 6 illustrates the sub-steps of step S110 corresponding to the embodiment of FIG. 5.

In some embodiments, the test signal generation circuit 220 can be implemented by a phase-locked loop (PLL). FIG. 5 is a diagram illustrating the realization of the test signal generation circuit 220 by the PLL 224. FIG. 6 shows the sub-steps of step S110 corresponds to this embodiment. Step S110 includes sub-steps S116 and S118. In step S116, the control circuit 250 generates a divisor (i.e., the control value SC being the divisor), and in step S118 the PLL 224 generates the test signal Vt according to the divisor and the reference frequency Fr. The control circuit 250 can adjust the frequency of the test signal Vt by controlling the control value SC. The detailed circuit of the PLL and its operation or control method are well known to people having ordinary skill in the art and are omitted for brevity.

Figure 7:
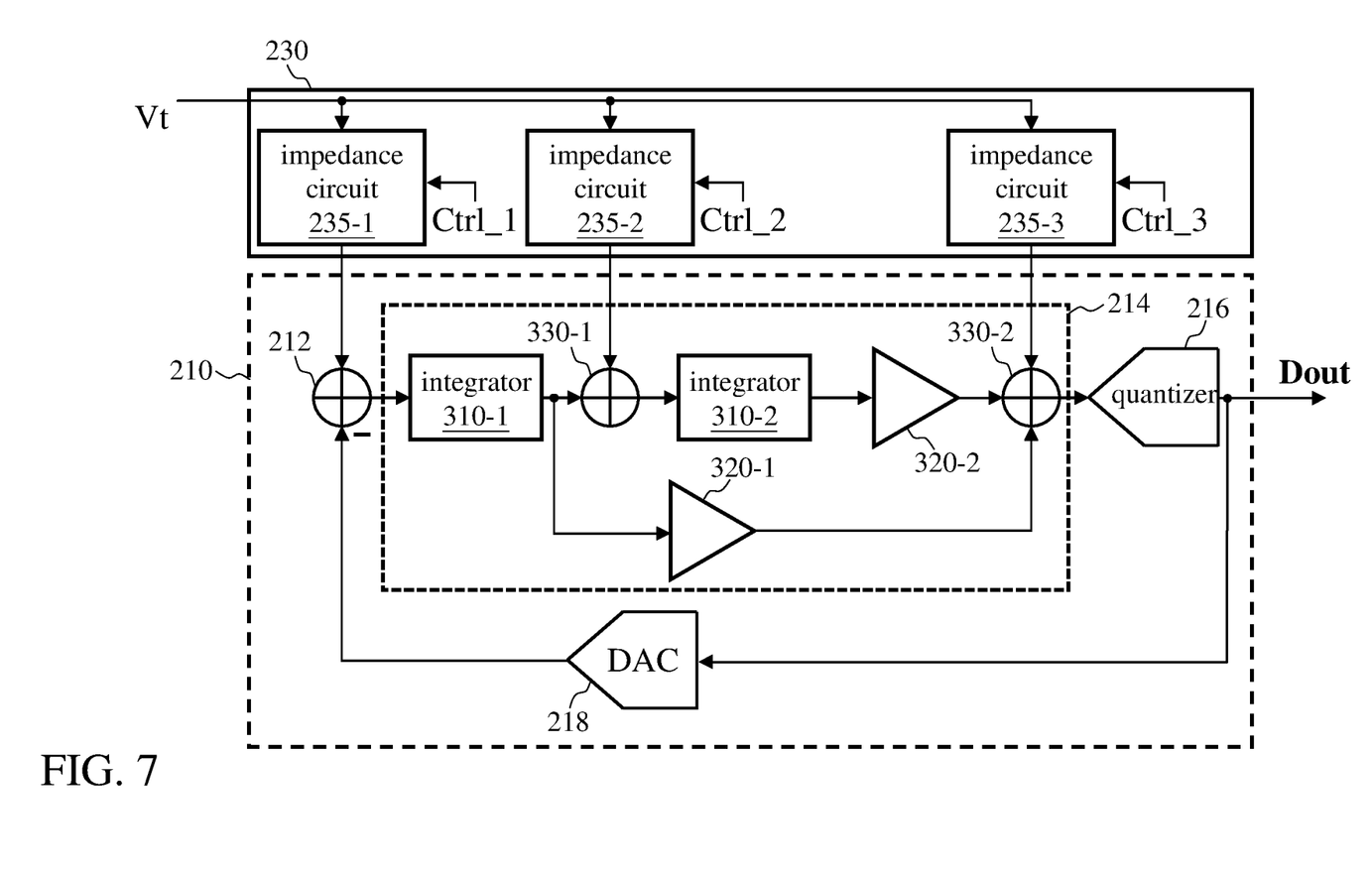
FIG. 7 illustrates the detailed circuit of the feedforward circuit 230 and the connections between the feedforward circuit 230 and the sigma-delta modulator 210.

Reference is made back to FIG. 1A. The control circuit 250 controls the test signal generation circuit 220 to input the test signal Vt to the feedforward circuit 230 (step S120). As shown in FIG. 2, the feedforward circuit 230 is coupled between the test signal generation circuit 220 and the SDM 210, and FIG. 7 shows the detailed circuit of the feedforward circuit 230 and the connections between the feedforward circuit 230 and the SDM 210. In the example of FIG. 7, the loop filter 214 is a second-order loop filter including two integrators 310 (the integrator 310-1 and integrator 310-2), two amplifiers 320 (the amplifier 320-1 and amplifier 320-2) and two adder circuits 330 (the adder circuit 330-1 and adder circuit 330-2). The operation principles of the loop filter 214 are well known to people having ordinary skill in the art and are omitted for brevity. The feedforward circuit 230 includes three impedance circuits 235, each receiving the test signal Vt. The impedance circuit 235-1 is coupled to the adder circuit 212, the impedance circuit 235-2 is coupled to the adder circuit 330-1, and the impedance circuit 235-3 is coupled to the adder circuit 330-2. The test signal Vt is fed to the adder circuit 212, the adder circuit 330-1, and the adder circuit 330-2 through the impedance circuit 235-1, the impedance circuit 235-2, and the impedance circuit 235-3, respectively. The impedance circuit 235-1, the impedance circuit 235-2, and the impedance circuit 235-3 are respectively controlled by the control signals Ctrl_1 to Ctrl_3 (collectively, the control signal Ctrl of FIG. 2) generated by the control circuit 250, so that their respective impedance values are controlled. As shown in FIG. 7, the test signal Vt is inputted to the SDM 210 via the feedforward circuit 230. In this way, the amplitude and/or phase of the test signal Vt can be changed by adjusting the impedance circuit 235. In some embodiments, the impedance circuit 235-1, the impedance circuit 235-2, and the impedance circuit 235-3 may be controlled independently. The operation details of the circuit of FIG. 7 can be found in: De Maeyer, J., Raman, J., Rombouts, P., & Weyten, L. (2005). Controlled behaviour of STF in CT ΣΔ modulators. Electronics letters, 41(16), 896-897.

In some embodiments, the impedance circuit 235-1, the impedance circuit 235-2, and the impedance circuit 235-3 may each include a variable resistor, a variable capacitor, or a variable resistor and a variable capacitor.

Next, in step S130, the control circuit 250 calculates the output signal Dout of the SDM 210 to obtain the value of the STF at the frequency to be tested. In some embodiments, the control circuit 250 has the capability of performing Fast Fourier Transform (FFT), and the control circuit 250 can perform the FFT operation on the output signal Dout and calculate the value of the STF at the frequency to be tested based on the FFT results.

Next, in step S140, the control circuit 250 determines whether the value of the SFT meets a criterion (e.g., whether the value of the STF is smaller than a preset value $D_{threshold}$ stored in the memory 240). This criterion can be set according to the practical operation scenario of the circuit. In some embodiments, different frequencies to be tested correspond to different criteria (e.g., different preset values).

When the value of the STF does not meet the criterion (NO branch of step S140), the control circuit 250 then determines whether all parameter combinations of the feedforward circuit 230 have been processed at the frequency to be tested (step S145). If not (NO branch of step S145), the control circuit 250 adjusts the parameters of the feedforward circuit 230 in the subsequent step S150; more specifically, the control circuit 250 adjusts the impedance circuit 235 of the feedforward circuit 230 in sub-step S155 of step S150. The impedance circuit 235 may include at least one of a resistor, a capacitor, and an inductor, and at least one of the resistor, the capacitor, and the inductor is adjustable. After the adjustment, the flow returns to step S130. The control circuit 250 repeatedly performs steps S130 to S150 until step S140 or S145 is determined YES. Taking the circuit of FIG. 7 as an example, if the impedance circuit 235-1, the impedance circuit 235-2, and the impedance circuit 235-3 each have five options (i.e., five setting values), the feedforward circuit 230 has a total of $5^3$=125 parameter combinations.

When the value of the STF meets the criterion (YES branch of step S140), or all the parameter combinations of the feedforward circuit 230 have been processed at the frequency to be tested (YES branch of step S145), the control circuit 250 checks whether there is any to-be-tested frequency that has not yet been corrected (step S160). If so (YES branch), the control circuit 250 selects another frequency to be tested (step S170), and then the flow returns to step S110; if not (NO branch), the correction process of the SDM 210 is ended (step S180). After the correction process is completed, the performance of the SDM 210 is close to or substantially the same as that of the original design (i.e., meeting the setting value of the STF) in the frequency band(s) of interest, which is/are made up of all frequencies to be tested. In other words, the corrected SDM 210 has overcome the negative impacts of PVT variations on the circuit.

Figure 1B:
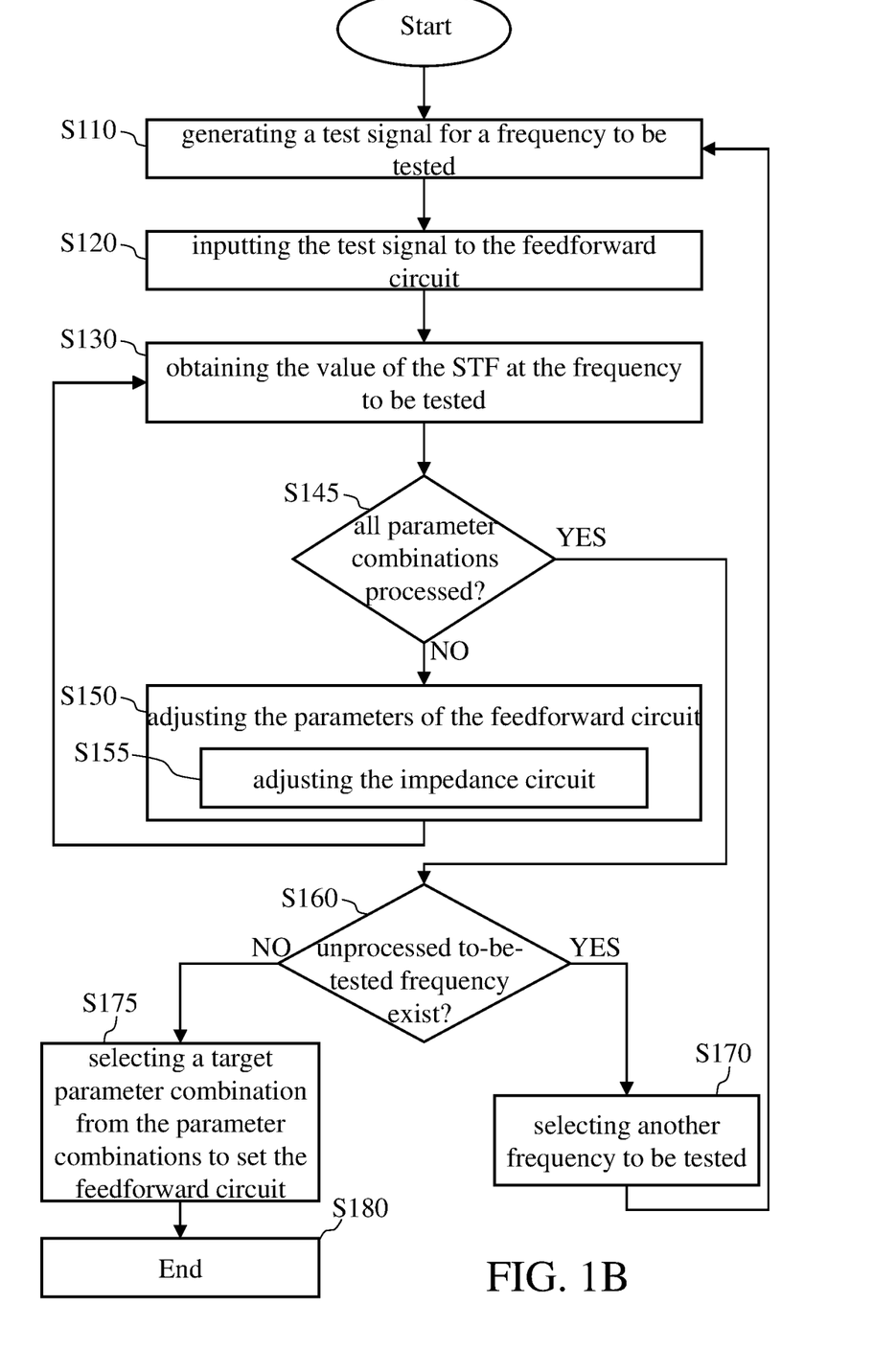
FIG. 1B illustrates a flow chart of a correction method for correcting an SDM according to another embodiment of this disclosure.

FIG. 1B is a flow chart of a correction method for correcting an SDM according to another embodiment of this disclosure. In this embodiment, the control circuit 250 does not determine whether the value of the STF meets the criterion when performing steps S130 to S150 (i.e., this embodiment not including step S140 of FIG. 1A). Instead, the control circuit 250 processes all parameter combinations of the feedforward circuit 230 for each frequency to be tested and record the value of the STF for each parameter combination at the frequency to be tested. For example, if the feedforward circuit 230 has M parameter combinations and there are a total number of N frequencies to be tested (M, N are positive integers), the control circuit 250 generates M STF values for each frequency to be tested. As a result, the control circuit 250 generates a total number of M*N STF values. The control circuit 250 can store the STF values in its own memory circuit (e.g., a register) or in the memory 240. After all the to-be-tested frequencies are tested (step S160 being NO), the control circuit 250 selects a target parameter combination from the M parameter combinations to set the feedforward circuit 230 (step S175), and then ends the correction process (step S180). The target parameter combination can cause more to-be-tested frequencies to meet the STF criterion(s) than other parameter combinations do; that is to say, the target parameter combination can make the most of the frequencies to be tested meet the STF criterion(s).

In some embodiments (reference is made to FIG. 1C which is a detailed flow of step S175 in FIG. 1B), the control circuit 250 may set weights (such as $a_1, a_2, \ldots, a_N$) and preset values (such as $D_{f1\_threshold}, D_{f2\_threshold}, \ldots, D_{fN\_threshold}$) for the N to-be-tested frequencies (step S1751) (the weights and the preset values can be stored in the memory 240). For each of the N to-be-tested frequencies, the M "differences between the STF values and the preset value" are multiplied by the corresponding weight to generate M*N weighted values (steps S1752, S1753). Next, the control circuit 250 sums up the N weighted values for each of the M parameter combinations to generate M weighted sums (step S1754), and then selects one of the M parameter combinations, according to the M weighted sums, as a target parameter combination to set the feedforward circuit 230 (step S1755). For example, assuming that there are two frequencies to be tested (f1 and f2) and two parameter combinations (S1 and S2), the control circuit 250 may calculate $a_1*(D_{f1\_threshold}-D_{f1\_S1})$, $a_1*(D_{f1\_threshold}-D_{f1\_S2})$, $a_2*(D_{f2\_threshold}-D_{f2\_S1})$, and $a_2*(D_{f2\_threshold}-D_{f2\_S2})$, where $D_{f1\_S1}$ and $D_{f1\_S2}$ are the STF values for f1, $D_{f2\_S1}$ and $D_{f2\_S2}$ are the STF values for f2, and $D_{f1\_threshold}$ and D threshold are the preset values for f1 and f2, respectively.

Figure 1C:
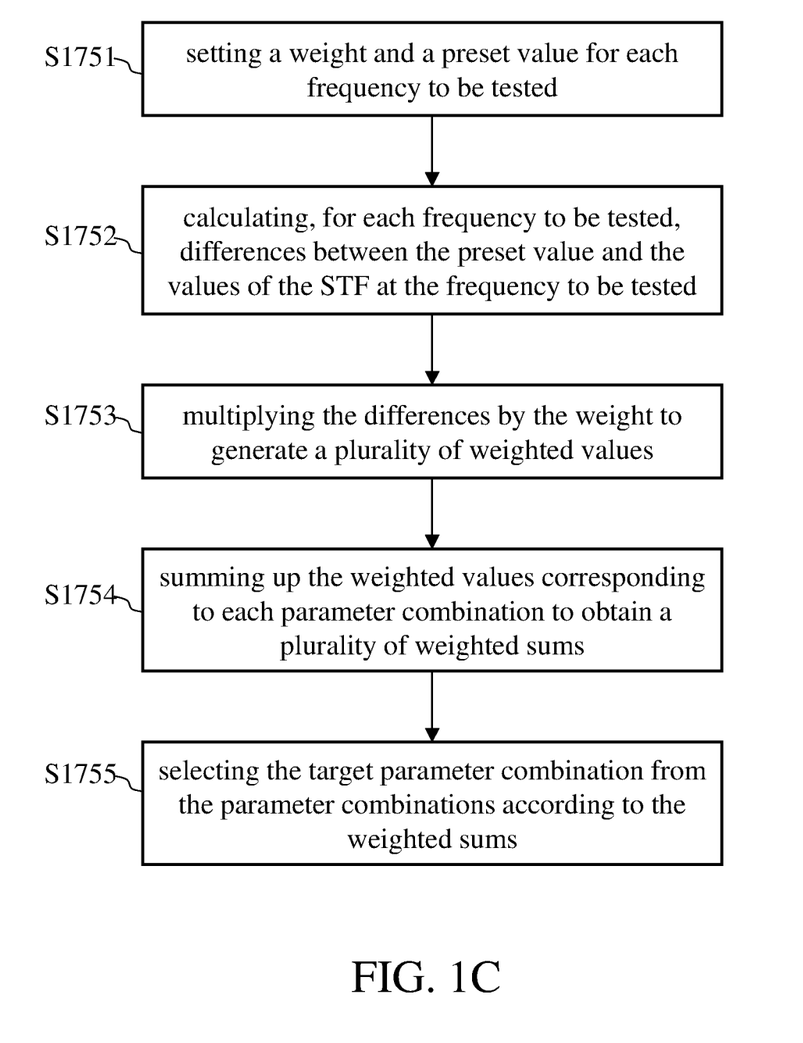
FIG. 1C illustrates a detailed flow of step S175 in FIG. 1B.

The control circuit 250 calculates the weighted sum for each of the parameter combinations S1 and S2—namely, $a_1*(D_{f1\_threshold}-D_{f1\_S1})+a_2*(D_{f2\_threshold}-D_{f2\_S1})$ for S1 and $a_1*(D_{f1\_threshold}-D_{f1\_S2})+a_2*(D_{f2\_threshold}-D_{f2\_S2})$ for S2, and finally selects the parameter combination corresponding to the greatest weighted sum as the target parameter combination.

In summary, even if the STF of the SDM 210 deviates from the original design due to PVT variations, this disclosure makes the STF meet the design criterion(s) by adjusting the parameters of the feedforward circuit 230, thereby overcoming the impacts of PVT variations. This disclosure aims to correct the STF of the SDM and has no influences on the noise transfer function (NTF) of the SDM. Moreover, since many chips have the foregoing test signal generation circuit (e.g., the DAC or PLL) built-in, this disclosure is easy to implement and cost-effective.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A correction method for correcting a sigma-delta modulator (SDM), the SDM comprising a loop filter, a quantizer, and a digital-to-analog converter (DAC), the correction method comprising:
   (A) generating a test signal for at least one frequency to be tested;
   (B) inputting the test signal to a feedforward circuit, wherein the feedforward circuit comprises at least one impedance circuit which is adjustable, and the test signal is inputted to the SDM via the impedance circuit;
   (C) calculating an output signal of the SDM to obtain a value of a signal transfer function (STF) of the SDM at the frequency to be tested; and
   (D) adjusting the impedance circuit.

2. The correction method of claim 1, wherein the impedance circuit comprises a variable resistor, a variable capacitor, or a combination of the variable resistor and the variable capacitor.

3. The correction method of claim 1, wherein the DAC is a first DAC, step (A) comprising:
   (A1) generating a digital code; and
   (A2) using a second DAC to convert the digital code to the test signal.

4. The correction method of claim 1, wherein step (A) comprises:
   (A1) generating a divisor; and
   (A2) using a phase-locked loop (PLL) to generate the test signal according to the divisor and a reference signal.

5. The correction method of claim 1, wherein the feedforward circuit comprises a plurality of parameter combinations, step (D) is substantially equivalent to adjusting the parameter combinations, and there are multiple frequencies to be tested, the correction method further comprising:

(E) for each frequency to be tested, performing step (A) one time and steps (B) to (D) multiple times to obtain a plurality of values of the STF at the frequency to be tested; and (F) selecting a target parameter combination from the parameter combinations to set the feedforward circuit; wherein the target parameter combination can make the most of the frequencies to be tested meet a criterion of the STF.

6. The correction method of claim 1, wherein the feedforward circuit comprises a plurality of parameter combinations, step (D) is substantially equivalent to adjusting the parameter combinations, and there are multiple frequencies to be tested, the correction method further comprising:

(E) for each frequency to be tested, performing step (A) one time and steps (B) to (D) multiple times to obtain a plurality of values of the STF at the frequency to be tested; and (F) selecting a target parameter combination from the parameter combinations to set the feedforward circuit, wherein step (F) comprises:
  (F1) setting a weight and a preset value for each frequency to be tested;
  (F2) calculating, for each frequency to be tested, differences between the preset value and the values of the STF at the frequency to be tested;
  (F3) multiplying the differences by the weight to generate a plurality of weighted values;
  (F4) summing up the weighted values corresponding to each parameter combination to obtain a plurality of weighted sums; and
  (F5) selecting the target parameter combination from the parameter combinations according to the weighted sums.

7. A correction circuit for correcting a sigma-delta modulator (SDM), the SDM comprising a loop filter, a quantizer, and a digital-to-analog converter (DAC), the correction circuit comprising:
  a feedforward circuit that is coupled to the SDM, comprises at least one impedance circuit, and is configured to receive a test signal and to input the test signal to the SDM;
  a memory that stores a plurality of program instructions; and
  a control circuit coupled to the memory and configured to execute the program instructions to correct the SDM;
  wherein correction procedures of the SDM comprise:
    (A) generating the test signal for at least one frequency to be tested;
    (B) inputting the test signal to the feedforward circuit;
    (C) calculating an output signal of the SDM to obtain a value of a signal transfer function (STF) of the SDM at the frequency to be tested; and
    (D) adjusting the impedance circuit.

8. The correction circuit of claim 7, wherein the impedance circuit comprises a variable resistor, a variable capacitor, or a combination of the variable resistor and the variable capacitor.

9. The correction circuit of claim 7, wherein the correction circuit further comprises a phase-locked loop (PLL) coupled to the control circuit and the feedforward circuit, step (A) comprising:
  (A1) generating a divisor; and
  (A2) using the PLL to generate the test signal according to the divisor and a reference signal.

10. The correction circuit of claim 7, wherein the feedforward circuit comprises a plurality of parameter combinations, step (D) is substantially equivalent to adjusting the parameter combinations, and there are multiple frequencies to be tested, the correction procedures of the SDM further comprising:

(E) for each frequency to be tested, performing step (A) one time and steps (B) to (D) multiple times to obtain a plurality of values of the STF at the frequency to be tested; and (F) selecting a target parameter combination from the parameter combinations to set the feedforward circuit; wherein the target parameter combination can make the most of the frequencies to be tested meet a criterion of the STF.

11. The correction circuit of claim 7, wherein the feedforward circuit comprises a plurality of parameter combinations, step (D) is substantially equivalent to adjusting the parameter combinations, and there are multiple frequencies to be tested, the correction procedures of the SDM further comprising:

(E) for each frequency to be tested, performing step (A) one time and steps (B) to (D) multiple times to obtain a plurality of values of the STF at the frequency to be tested; and (F) selecting a target parameter combination from the parameter combinations to set the feedforward circuit, wherein step (F) comprises:
  (F1) setting a weight and a preset value for each frequency to be tested;
  (F2) calculating, for each frequency to be tested, differences between the preset value and the values of the STF at the frequency to be tested;
  (F3) multiplying the differences by the weight to generate a plurality of weighted values;
  (F4) summing up the weighted values corresponding to each parameter combination to obtain a plurality of weighted sums; and
  (F5) selecting the target parameter combination from the parameter combinations according to the weighted sums.

12. A correction circuit for correcting a sigma-delta modulator (SDM), the SDM comprising a loop filter, a quantizer, and a first digital-to-analog converter (DAC), the correction circuit comprising:
  a feedforward circuit that is coupled to the SDM, comprises at least one impedance circuit, and is configured to receive a test signal and to input the test signal to the SDM;
  a memory that stores a plurality of program instructions;
  a control circuit coupled to the memory and configured to execute the program instructions to correct the SDM; and
  a second DAC, coupled to the control circuit and the feedforward circuit;
  wherein correction procedures of the SDM comprise:
    (A) generating a digital code;
    (B) using the second DAC to convert the digital code to the test signal for at least one frequency to be tested;
    (C) inputting the test signal to the feedforward circuit;
    (D) calculating an output signal of the SDM to obtain a value of a signal transfer function (STF) of the SDM at the frequency to be tested; and
    (E) adjusting the impedance circuit.

13. The correction circuit of claim 12, wherein the impedance circuit comprises a variable resistor, a variable capacitor, or a combination of the variable resistor and the variable capacitor.

14. The correction circuit of claim 12, wherein the feedforward circuit comprises a plurality of parameter combinations, step (E) is substantially equivalent to adjusting the parameter combinations, and there are multiple frequencies to be tested, the correction procedures of the SDM further comprising:
- (F) for each frequency to be tested, performing steps (A) and (B) one time and steps (C) to (E) multiple times to obtain a plurality of values of the STF at the frequency to be tested; and
- (G) selecting a target parameter combination from the parameter combinations to set the feedforward circuit;

wherein the target parameter combination can make the most of the frequencies to be tested meet a criterion of the STF.

15. The correction circuit of claim 12, wherein the feedforward circuit comprises a plurality of parameter combinations, step (E) is substantially equivalent to adjusting the parameter combinations, and there are multiple frequencies to be tested, the correction procedures of the SDM further comprising:
- (F) for each frequency to be tested, performing steps (A) and (B) one time and steps (C) to (E) multiple times to obtain a plurality of values of the STF at the frequency to be tested; and
- (G) selecting a target parameter combination from the parameter combinations to set the feedforward circuit, wherein step (G) comprises:
  - (G1) setting a weight and a preset value for each frequency to be tested;
  - (G2) calculating, for each frequency to be tested, differences between the preset value and the values of the STF at the frequency to be tested;
  - (G3) multiplying the differences by the weight to generate a plurality of weighted values;
  - (G4) summing up the weighted values corresponding to each parameter combination to obtain a plurality of weighted sums; and
  - (G5) selecting the target parameter combination from the parameter combinations according to the weighted sums.

* * * * *